(12) United States Patent
Okita

(10) Patent No.: US 9,904,122 B2
(45) Date of Patent: Feb. 27, 2018

(54) DISPLAY DEVICE

(71) Applicant: Japan Display Inc., Minato-ku (JP)

(72) Inventor: Mitsutaka Okita, Tokyo (JP)

(73) Assignee: Japan Display Inc., Minato-ku (JP)

( * ) Notice: Subject to any disclaimer, the term of this patent is extended or adjusted under 35 U.S.C. 154(b) by 36 days.

(21) Appl. No.: 15/089,880

(22) Filed: Apr. 4, 2016

(65) Prior Publication Data

US 2016/0306237 A1    Oct. 20, 2016

(30) Foreign Application Priority Data

Apr. 14, 2015    (JP) ................. 2015-082378

(51) Int. Cl.
| | |
|---|---|
| *G02F 1/1343* | (2006.01) |
| *H01L 27/12* | (2006.01) |
| *G02F 1/1362* | (2006.01) |

(52) U.S. Cl.
CPC ...... *G02F 1/134309* (2013.01); *H01L 27/124* (2013.01); *G02F 1/136286* (2013.01); *G02F 2001/134345* (2013.01); *G02F 2201/52* (2013.01)

(58) Field of Classification Search
CPC .............................................. G02F 1/134309
See application file for complete search history.

(56) References Cited

U.S. PATENT DOCUMENTS

| | | | | |
|---|---|---|---|---|
| 2002/0140655 A1* | 10/2002 | Liang | ................... | G09G 3/2003 345/89 |
| 2003/0128179 A1* | 7/2003 | Credelle | ........... | G02F 1/133514 345/88 |
| 2003/0222840 A1* | 12/2003 | Koga | ................... | G09G 3/3696 345/89 |
| 2004/0051724 A1* | 3/2004 | Elliott | ............... | G02F 1/133514 345/694 |
| 2005/0225575 A1* | 10/2005 | Brown Elliott | ... | G02F 1/133514 345/694 |
| 2005/0231534 A1* | 10/2005 | Lee | ........................ | G09G 3/2003 345/690 |
| 2005/0270444 A1* | 12/2005 | Miller | .................. | G09G 3/3216 349/108 |
| 2007/0064020 A1* | 3/2007 | Credelle | .............. | G09G 3/2003 345/694 |
| 2007/0205423 A1* | 9/2007 | Yamazaki | ........... | H01L 27/3213 257/89 |

(Continued)

FOREIGN PATENT DOCUMENTS

JP     2011-249334     12/2011

*Primary Examiner* — Sang V Nguyen
(74) *Attorney, Agent, or Firm* — Oblon, McClelland, Maier & Neustadt, L.L.P.

(57) ABSTRACT

According to one embodiment, a display device, includes a first main pixel including a first sub-pixel, a second sub-pixel which is arranged in a first direction of the first sub-pixel, and a third sub-pixel which is arranged in a second direction of the first sub-pixel and the first direction of the second sub-pixel, and a second main pixel including a fourth sub-pixel which is arranged in the second direction of the third sub-pixel, a fifth sub-pixel which is arranged in the first direction of the fourth sub-pixel and the second direction of the second sub-pixel, and a sixth sub-pixel which is arranged in the first direction of the fourth sub-pixel and the second direction of the fifth sub-pixel.

6 Claims, 12 Drawing Sheets

(56) References Cited

U.S. PATENT DOCUMENTS

| | | | |
|---|---|---|---|
| 2009/0059135 A1* | 3/2009 | Park | G02F 1/133555 349/96 |
| 2009/0121983 A1* | 5/2009 | Sung | H01L 27/3218 345/76 |
| 2009/0128467 A1* | 5/2009 | Chen | G09G 3/3607 345/87 |
| 2011/0291550 A1* | 12/2011 | Kim | G09G 3/2003 313/504 |
| 2014/0204008 A1* | 7/2014 | Chu-Ke | G09G 3/2003 345/88 |
| 2015/0061978 A1* | 3/2015 | Shih | G09G 3/3225 345/76 |
| 2015/0207094 A1* | 7/2015 | Hwang | H01L 51/5203 257/88 |
| 2016/0155397 A1* | 6/2016 | Yang | G09G 3/3607 345/87 |
| 2016/0181279 A1* | 6/2016 | Choung | H01L 27/1244 257/72 |

\* cited by examiner

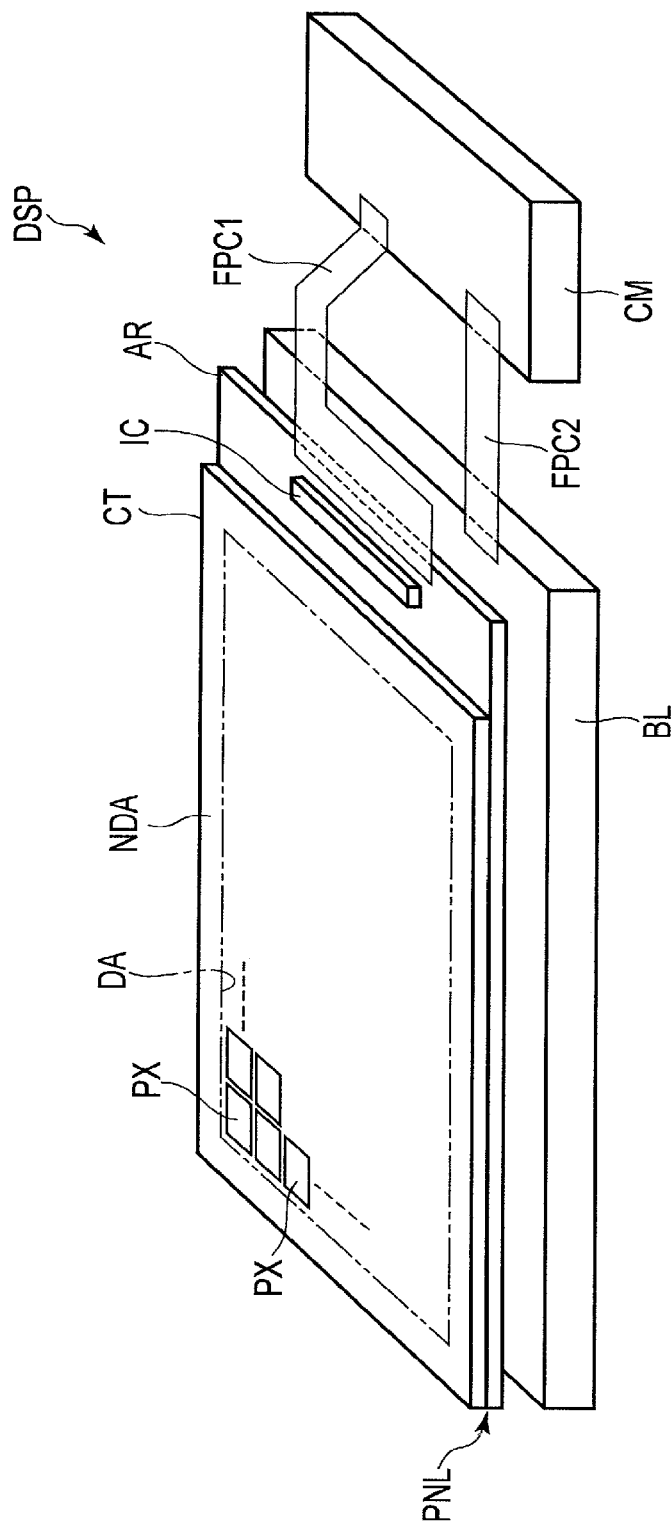
F I G. 1

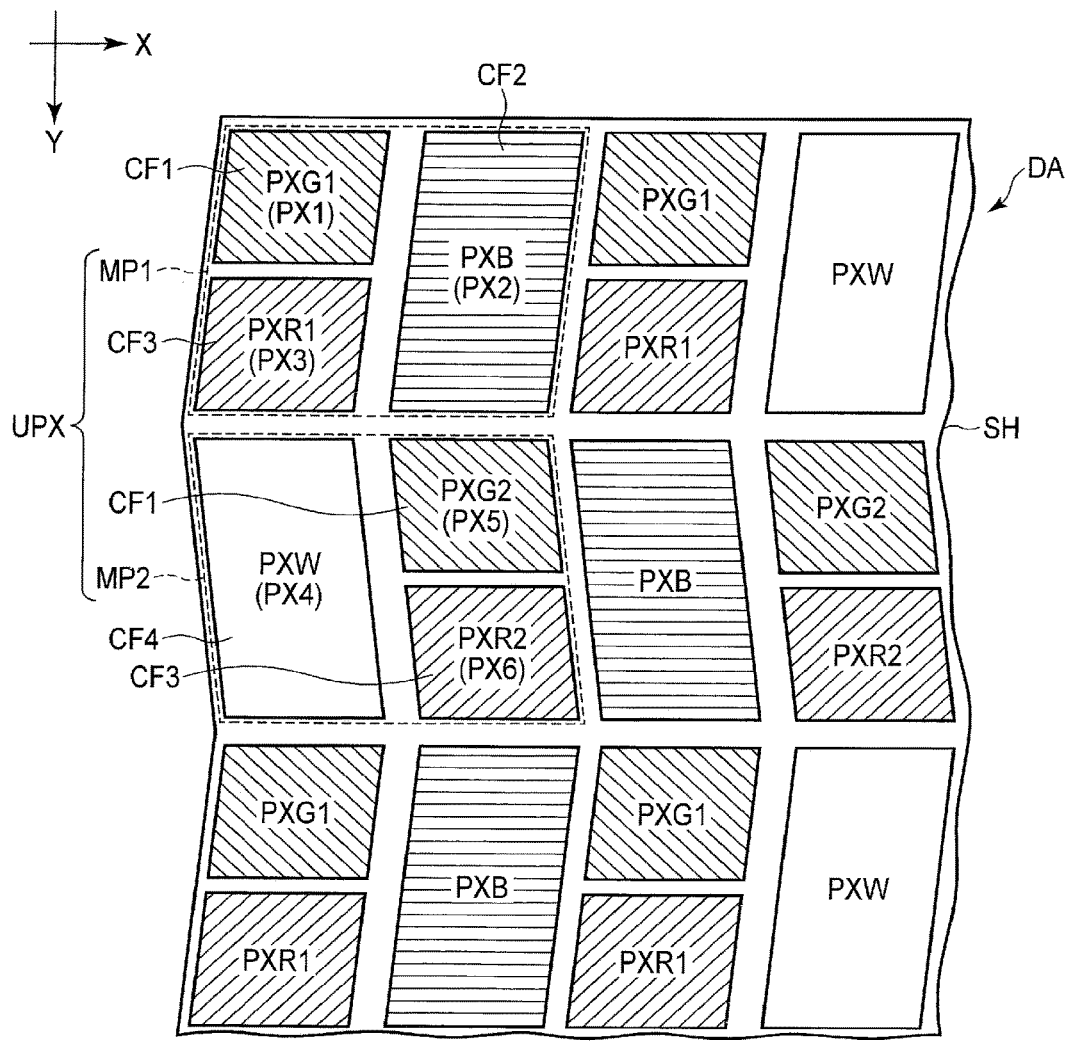
F I G. 3

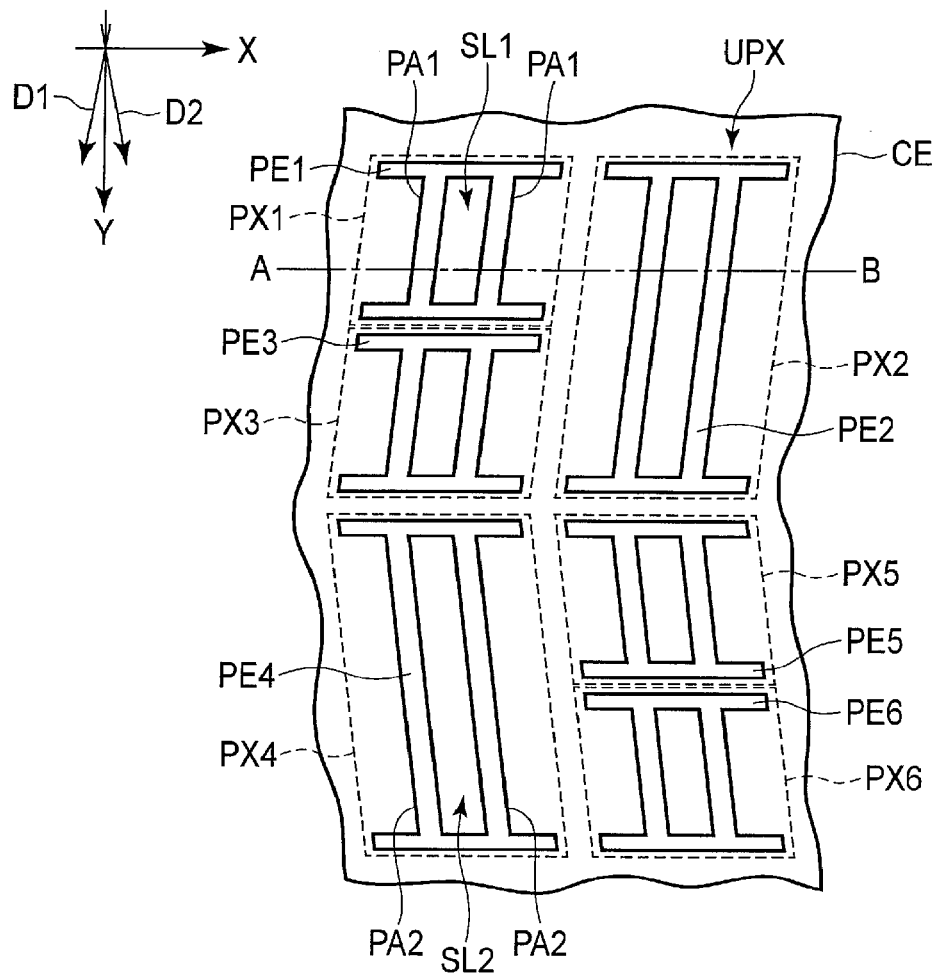
F I G. 5

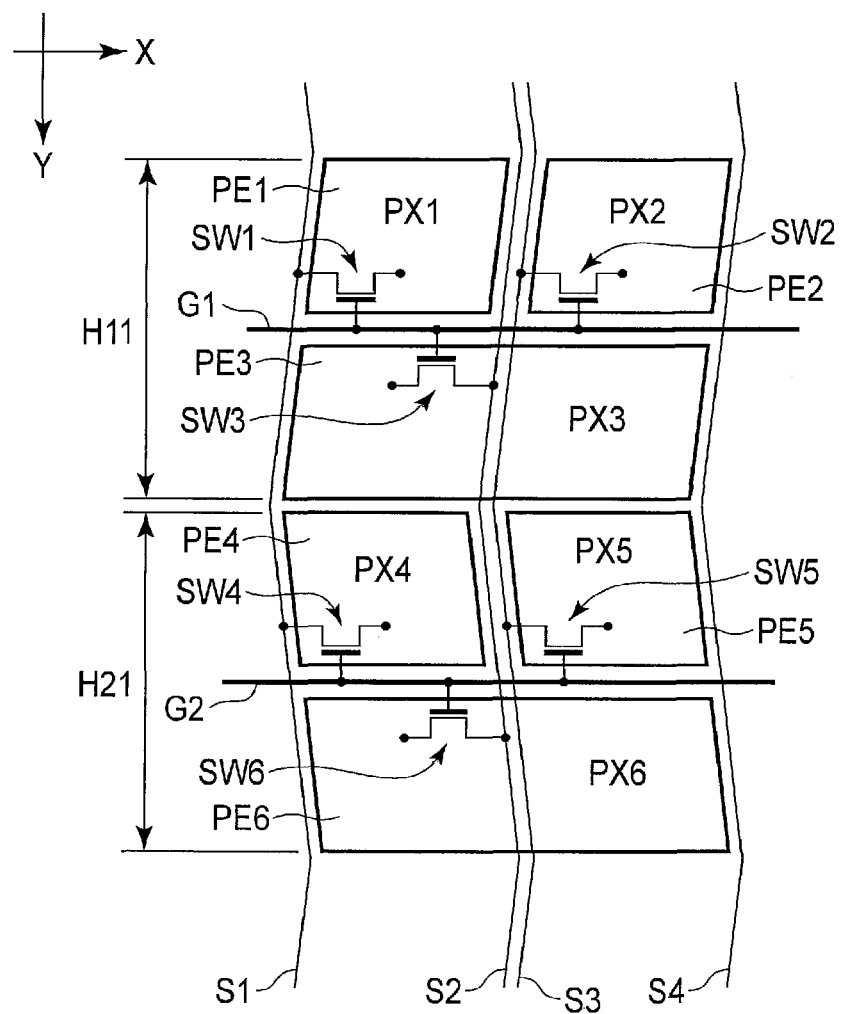
F I G. 10

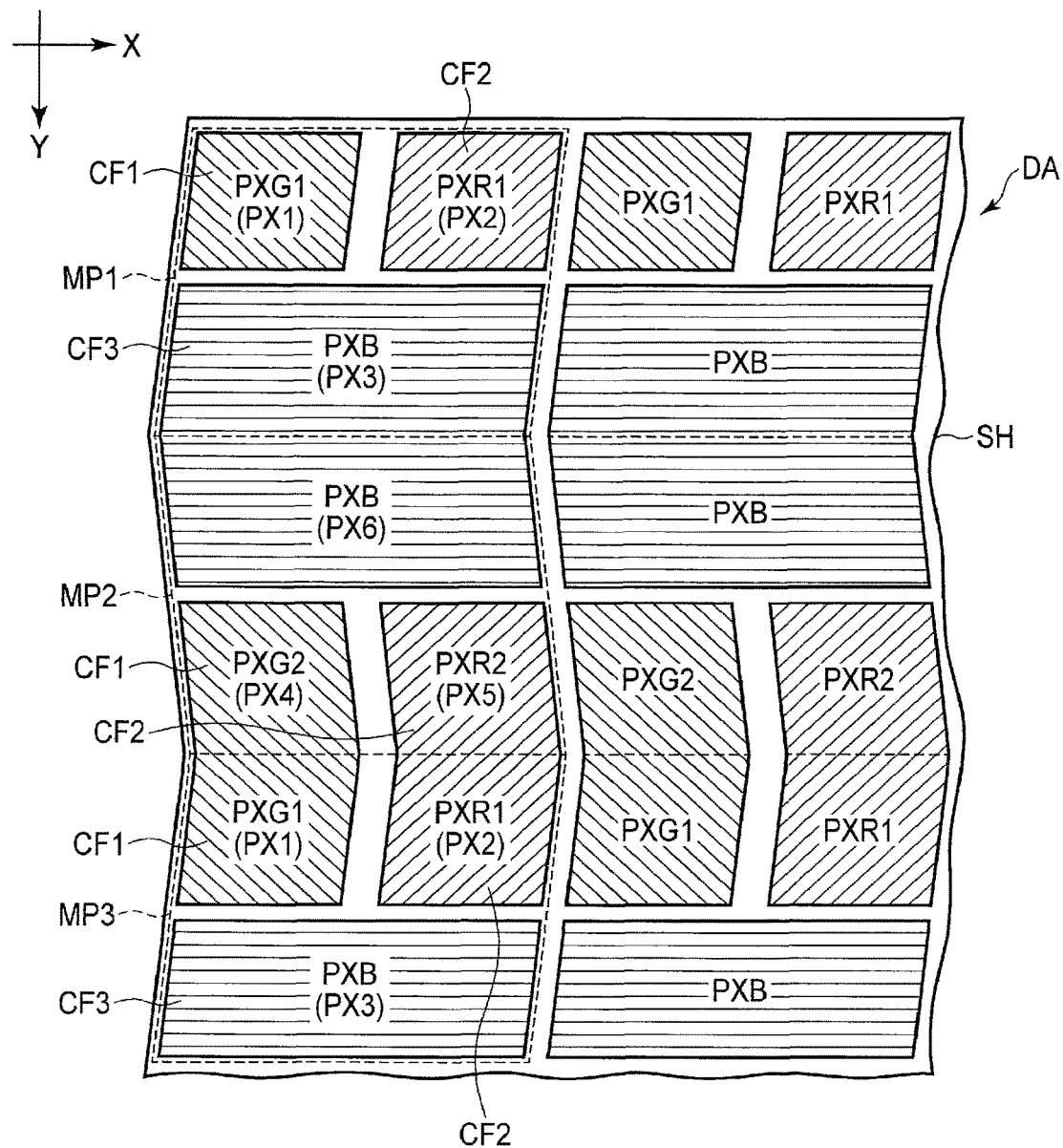
F I G. 12

DISPLAY DEVICE

CROSS-REFERENCE TO RELATED APPLICATIONS

This application is based upon and claims the benefit of priority from Japanese Patent Application No. 2015-082378, filed Apr. 14, 2015, the entire contents of which are incorporated herein by reference.

FIELD

Embodiments described herein relate generally to a display device.

BACKGROUND

In a display device comprising a pair of substrates opposed to each other, a structure involving the bonding one of the substrates on which signal lines, switching elements, pixel electrodes and the like are formed, and the other substrate on which a light-shielding layer, color filters and the like are formed, has been widely adopted. In such a display device, if a displacement in the bonding occurs between the substrates, a phenomenon of color mixing in which colors of adjacent pixels are visually mixed occurs, and the aperture ratio is lowered for the reason that the signal lines and the opposing light-shielding layer are displaced.

Recently, higher resolution and a higher aperture ratio have been required for display devices for smartphones or tablets. As the pixel size becomes small with a higher resolution, the aperture ratio becomes reduced since the proportion of signal lines and the light-shielding layer to the pixel area becomes higher. For example, an organic field light-emitting display device in which a first sub-pixel emitting light of a first color and a second sub-pixel emitting light of a second color are disposed in the same column line, and a third sub-pixel emitting light of a third color is disposed in a column line adjacent to the column line of the first sub-pixel and the second sub-pixel, is well known as an example of a technology for securing the aperture ratio while achieving high resolution.

BRIEF DESCRIPTION OF THE DRAWINGS

FIG. 1 is a perspective view schematically showing a configuration of a display device DSP.

FIG. 3 is an illustration showing an example of pixel array in the display area DA.

FIG. 5 is an illustration showing a configuration example of pixel electrodes PE1 to PE6.

FIG. 10 is an illustration showing a configuration example of a unit pixel UPX shown in FIG. 9.

FIG. 12 is an illustration showing yet another example of the pixel array in the display area DA.

DETAILED DESCRIPTION

Figure 2:
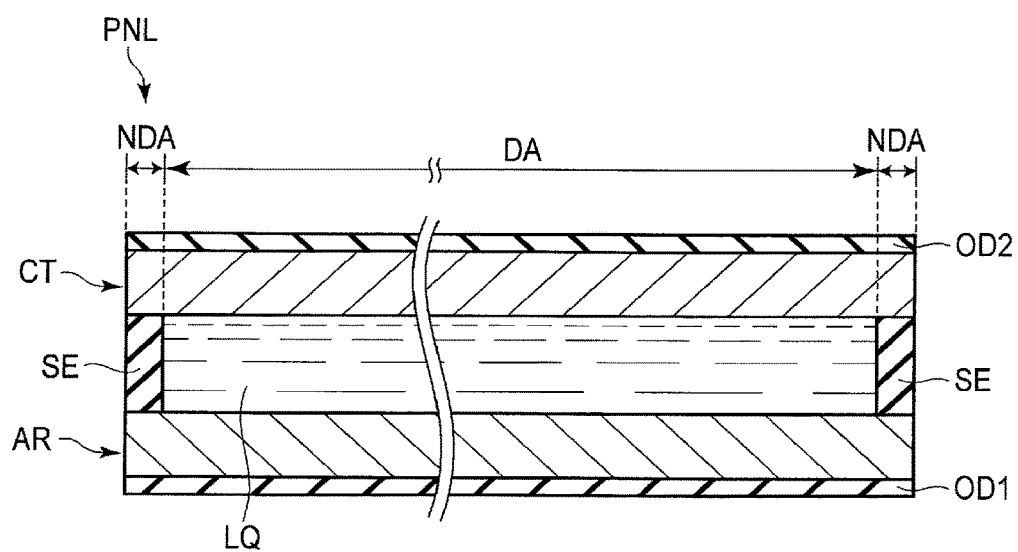
FIG. 2 is a schematic view showing a cross-section of the display panel PNL.

In general, according to one embodiment, a display device, includes: a first main pixel including a first sub-pixel which exhibits a first color, a second sub-pixel which exhibits a second color different from the first color and is arranged in a first direction with respect to the first sub-pixel, and a third sub-pixel which exhibits a third color different from the first and second colors and is arranged in a second direction with respect to the first sub-pixel and the first direction with respect to the second sub-pixel; and a second main pixel including a fourth sub-pixel which exhibits a fourth color different from the first to third colors and is arranged in the second direction with respect to the third sub-pixel, a fifth sub-pixel which exhibits one of the first color and the third color and is arranged in the first direction with respect to the fourth sub-pixel and the second direction with respect to the second sub-pixel, and a sixth sub-pixel which exhibits the other of the first color and the third color and is arranged in the first direction with respect to the fourth sub-pixel and the second direction with respect to the fifth sub-pixel.

According to another embodiment, a display device, includes: a first main pixel including a first sub-pixel which exhibits a first color, a second sub-pixel which exhibits a second color different from the first color and is arranged in a first direction with respect to the first sub-pixel, and a third sub-pixel which exhibits a third color different from the first and second colors and is arranged in a second direction with respect to the first and second sub-pixels; and a second main pixel arranged in the second direction with respect to the first main sub-pixel, including a fourth sub-pixel which exhibits one of the first and second colors, a fifth sub-pixel which exhibits the other of the first and second colors and is arranged in the first direction with respect to the fourth sub-pixel, and a sixth sub-pixel which is arranged in the second direction with respect to the fourth and fifth sub-pixels.

One of the embodiments will be described hereinafter with reference to the accompanying drawings. The disclosure is a mere example, and arbitrary change of gist which can be easily conceived by a person of ordinary skill in the art naturally falls within the inventive scope. Furthermore, a width, thickness, shape and the like of each element are depicted schematically in the Figures as compared to actual embodiments for the sake of simpler explanation, and they are not to limit the interpretation of the invention of the present application. In each of the drawings, some of reference numbers of identical or similar elements, which are successively disposed, may be omitted. In the specification and drawings, components that fulfill same or similar functions are denoted by the same reference numeral and their overlapping descriptions may be omitted.

In the present embodiment, a liquid crystal display device is described as an example of the display device. The liquid crystal display device can be used for, for example, various devices such as a smartphone, a tablet terminal, a mobile telephone terminal, a personal computer, a TV receiver, a vehicle-mounted device, and a game device. The major configuration explained in the present embodiment can also be applied to a self-luminous display device comprising an organic electroluminescent display element, and the like, an electronic paper display device comprising a cataphoretic element, and the like, a display device employing microelectromechanical systems (MEMS), or a display device employing electrochromism.

FIG. 1 is a perspective view schematically showing a configuration of a display device DSP.

The display device DSP comprises an active-matrix display panel PNL, a driving IC chip IC which drives the display panel PNL, a backlight unit BL which illuminates the display panel PNL, a control module CM, flexible printed circuits FPC1 and FPC2, and the like.

The display panel PNL includes an array substrate AR and a counter-substrate CT opposed to the array substrate AR. In the present embodiment, the array substrate AR functions as a first substrate and the counter-substrate CT functions as a second substrate. The display panel PNL includes a display area DA on which an image is displayed and a frame-shaped non-display area NDA surrounding the display area DA. The display panel PNL includes pixels (corresponding to sub-pixels to be explained later) PX arrayed in a matrix in the display area DA.

The backlight unit BL is disposed on a back surface of the array substrate AR. Various types of units are applicable as the backlight unit BL, but the detailed explanations are omitted. The driving IC chip IC is mounted on the array substrate AR. The flexible printed circuit FPC1 connects the display panel PNL with the control module CM. The flexible printed circuit FPC2 connects the backlight unit BL with the control module CM.

The display device DSP having such a configuration corresponds to what is called a transmissive-type liquid crystal display device which displays an image by selectively transmitting light incident from the backlight unit BL onto the display panel PNL in each pixel PX. However, the display device DSP may be a reflective-type liquid crystal display device which displays an image by selectively reflecting external light incident from the outside onto the display panel PNL in each pixel PX or a semi-transmissive liquid crystal display device having functions of both the transmissive-type and reflective-type liquid crystal display devices.

FIG. 2 is a schematic view showing a cross-section of the display panel PNL.

The display panel PNL includes the array substrate AR, the counter-substrate CT, a liquid crystal layer LQ, a sealing member SE, optical elements OD1 and OD2, and the like. The array substrate AR and the counter-substrate CT will be explained in detail later.

The sealing member SE is disposed in the non-display area NDA to adhere the array substrate AR and the counter-substrate CT. The liquid crystal layer LQ is held between the array substrate AR and the counter-substrate CT. The optical element OD1 is disposed on a side opposite to a surface of the array substrate AR which is in contact with the liquid crystal layer LQ. The optical element OD2 is disposed on a side opposite to a surface of the counter-substrate CT which is in contact with the liquid crystal layer LQ. Each of the optical elements OD1 and OD2 comprises a polarizer. Each of the optical elements OD1 and OD2 may comprise other optical elements such as a retardation film.

The detailed configuration of the display panel PNL is not explained here but, the display panel PNL may have any configuration corresponding to a display mode using a longitudinal electric field along a normal line of a main surface of the substrate, a display mode using an oblique electric field which is tilted in a direction oblique to the main surface of the substrate, a display mode using a lateral electric field along the main surface of the substrate, and a display mode using an arbitrary combination of the longitudinal electric field, the lateral electric field and the oblique electric field.

FIG. 3 is an illustration showing an example of pixel array in the display area DA. The first direction X and the second direction Y are perpendicular to each other. In the example illustrated, the display area DA includes at least two types of main pixels MP1 and MP2. Each of the main pixels MP1 and MP2 includes sub-pixels. The main pixels MP1 and MP2 are arranged in the second direction Y and constitute a unit pixel UPX. The unit pixel UPX corresponds to a minimum unit to display a color image. It should be noted that the sub-pixels arranged in the first direction X are referred to as row pixels while the sub-pixels arranged in the second direction Y are referred to as column pixels.

The main pixel MP1 includes sub-pixels PX1 to PX3. The sub-pixels PX1 and PX3 are arranged in the second direction Y. The sub-pixel PX2 is arranged in the first direction X of the sub-pixels PX1 and PX3. The sub-pixel PX1 is a pixel exhibiting the first color and includes the color filter CF1 of the first color. The sub-pixel PX2 is a pixel exhibiting the second color different from the first color and includes the color filter CF2 of the second color. The sub-pixel PX3 is a pixel exhibiting the third color different from the first and second colors and includes the color filter CF3 of the third color.

The main pixel MP2 includes sub-pixels PX4 to PX6. The sub-pixels PX5 and PX6 are arranged in the second direction Y. The sub-pixel PX4 is arranged in the first direction X of the sub-pixels PX5 and PX6. The sub-pixel PX4 is arranged in the second direction Y of the sub-pixel PX3. The sub-pixel PX5 is arranged in the second direction Y of the sub-pixel PX2. In other words, the sub-pixel PX4 is located in the same column as the sub-pixels PX1 and PX3 and the column different from or adjacent to the column of the sub-pixel PX2. The sub-pixel PX4 is a pixel exhibiting a fourth color different from the first to third colors and includes a color filter CF4 of the fourth color. The sub-pixel PX5 is a pixel exhibiting either of the first color and the third color. The sub-pixel PX6 is a pixel exhibiting the other of the first color and the third color. In the example illustrated, the sub-pixel PX5 is a pixel exhibiting the first color and includes the color filter CF1. The sub-pixel PX6 is a pixel exhibiting the third color and includes the color filter CF3.

For example, the first color is green, the second color is blue, the third color is red, and the fourth color is white or substantially transparent. The color filters CF1 to CF3 are formed of colored resin materials. The color filter CF4 is formed of a transparent resin material or a light-colored resin material. In the present specification, for example, light having a wavelength range from 380 to 780 nm is defined as "visible light". The "blue" color is defined as a color having a transmittance peak within a first wavelength range of 380 nm or longer and shorter than 490 nm. The "green" color is defined as a color having a transmittance peak within a second wavelength range of 490 nm or longer and shorter than 590 nm. The "red" color is defined as a color having a transmittance peak within a third wavelength range of 590 nm or longer and shorter than 780 nm. The expression "substantially transparent" implies not only an achromatic color, but also any light color of the visible light.

In the example illustrated, the sub-pixel PX1 corresponds to a green sub-pixel PXG1 including the green color filter CF1, the sub-pixel PX2 corresponds to a green sub-pixel PXB including the blue color filter CF2, the sub-pixel PX3 corresponds to a red sub-pixel PXR1 including the red color filter CF3, the sub-pixel PX4 corresponds to a sub-pixel PXW including the white or transparent color filter CF4, the sub-pixel PX5 corresponds to a green sub-pixel PXG2 including the green color filter CF1, and the sub-pixel PX6 corresponds to a red sub-pixel PXR2 including the red color filter CF3. In the example illustrated, the blue sub-pixel PX2 and the white or transparent sub-pixel PX4 are located in different columns, in the unit pixel UPX. The sub-pixel PXW may not include a color filter.

However, the unit pixel UPX may include a sub-pixel exhibiting a color other than green, red, blue and white or may be composed of sub-pixels of three colors, i.e., green, red and blue, except a white sub-pixel. The sub-pixels PX2 and PX4 may be replaced with each other, in the unit pixel UPX. In the example illustrated, in the other unit pixel arranged in the first direction X of the unit pixel UPX, the white sub-pixel PXW is disposed at a position arranged in the first direction X of the main pixel MP1, and the blue sub-pixel PXB is disposed at a position arranged in the first direction X of the main pixel MP2, though not described in detail.

In the unit pixel UPX, the sub-pixels PX1, PX3, PX5 and PX6 have a substantially equal first area, and the sub-pixels PX2 and PX4 have a second area larger than the first area. In the example illustrated, the sub-pixels PX2 and PX4 have a portrait shape extending in the second direction Y. For example, the second area is approximately twice as large as the first area.

Each of the color filters CF1 to CF4 is disposed in a layout of the corresponding sub-pixel and has the area corresponding to the size of the sub-pixel. Each of the color filters CF1 to CF4 is formed in an insular shape. The color filters CF1 and CF2 have the substantially equal first area. The color filters CF3 and CF4 have the substantially equal second area. The light-shielding layer SH is disposed to section the sub-pixels, and extend between the sub-pixels adjacent to each other in the first direction X and the second direction Y.

The shape of the sub-pixels is not limited to an approximate parallelogram as shown in the figure, but may be a square or a rectangle. The sub-pixel PX2 may have an area different from the area of the sub-pixel PX4. The sub-pixels PX1, PX3, PX5 and PX6 may have areas different from each other.

Figure 4:
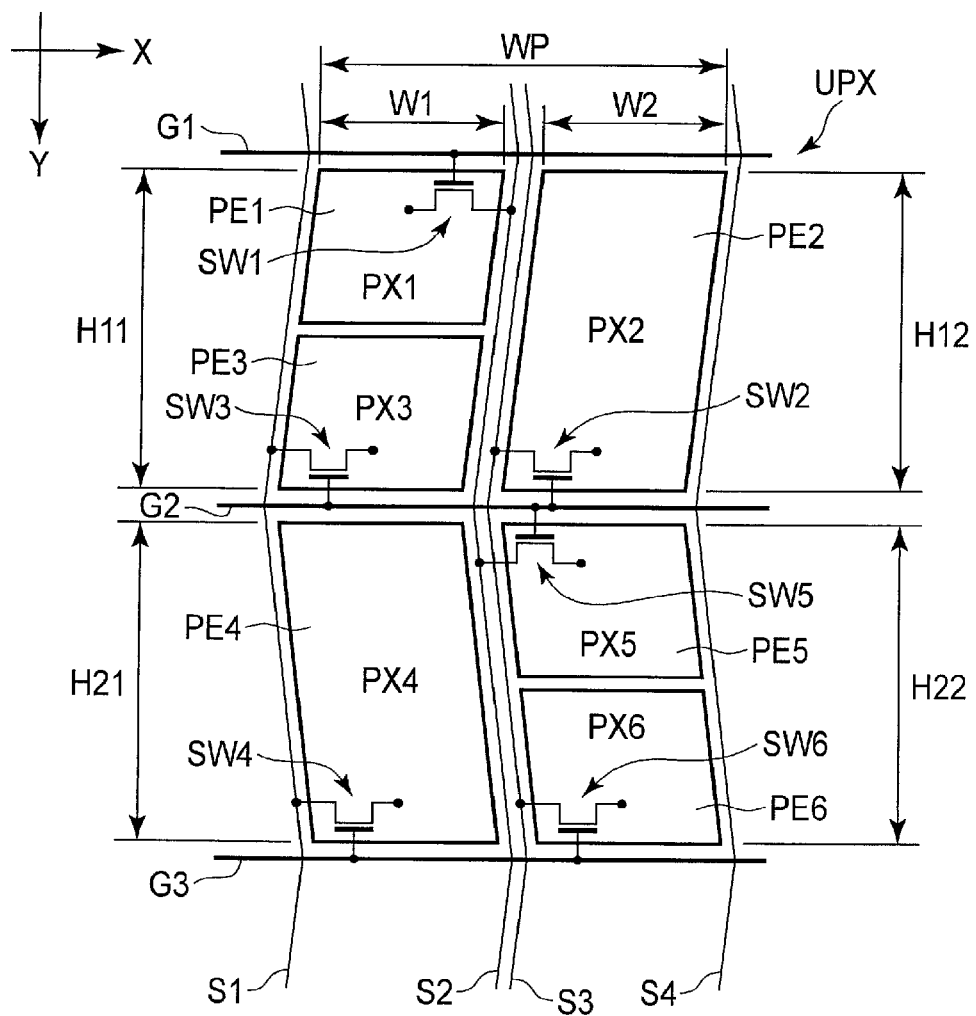
FIG. 4 is an illustration showing a configuration example of the unit pixel UPX shown in FIG. 3.

FIG. 4 is an illustration showing a configuration example of the unit pixel UPX shown in FIG. 3.

The source lines S1 to S4 are arranged in the first direction X. The gate lines G1 to G3 are arranged in the second direction Y. In the example illustrated, each of the gate lines G1 to G3 extends linearly along the first direction X. The source lines S1 to S4 are bent in accordance with shapes of the sub-pixels.

The sub-pixels PX1 to PX3 are surrounded by the gate lines G1 and G2 and the source lines S1 and S2. The sub-pixel PX2 is surrounded by the gate lines G1 and G2 and the source lines S3 and S4. The sub-pixel PX4 is surrounded by the gate lines G2 and G3 and the source lines S1 and S2. The sub-pixels PX5 and PX6 are surrounded by the gate lines G2 and G3 and the source lines S3 and S4.

The sub-pixel PX1 includes a switching element SW1 electrically connected with the gate line G1 and the source line S2, and a pixel electrode PE1 electrically connected with the switching element SW1. The sub-pixel PX2 includes a switching element SW2 electrically connected with the gate line G2 and the source line S3, and a pixel electrode PE2 electrically connected with the switching element SW2. The sub-pixel PX3 includes a switching element SW3 electrically connected with the gate line G2 and the source line S1, and a pixel electrode PE3 electrically connected with the switching element SW3.

The sub-pixel PX4 includes a switching element SW4 electrically connected with the gate line G3 and the source line S1, and a pixel electrode PE4 electrically connected with the switching element SW4. The sub-pixel PX5 includes a switching element SW5 electrically connected with the gate line G2 and the source line S2, and a pixel electrode PE5 electrically connected with the switching element SW5. The sub-pixel PX6 includes a switching element SW6 electrically connected with the gate line G3 and the source line S3, and a pixel electrode PE6 electrically connected with the switching element SW6.

The pixel electrodes PE1 to PE3 are located between the gate lines G1 and G2, and the pixel electrodes PE4 to PE6 are located between the gate lines G2 and G3. The pixel electrodes PE1, PE3 and PE4 are located between the source lines S1 and S2. The pixel electrodes PE2, PE5 and PE6 are located between the source lines S3 and S4.

Each of the sub-pixels PX1, PX3 and PX4 has a width W1 along the first direction X. Each of the sub-pixels PX2, PX5 and PX6 has a width W2 along the first direction X. If the sum of width of the sub-pixels PX1 and PX2 along the first direction X or the width of the unit pixel UPX along the first direction X is represented by WP, each of the widths W1 and W2 is greater than one third of the sum WP and smaller than two thirds of the sum WP. In the example illustrated, each of the widths W1 and W2 is approximately a half of the sum WP. In addition, a sum of length H11 of the sub-pixels PX1 and PX3 along the second direction Y, a length H12 of the sub-pixel PX2 along the second direction Y, a length H21 of the sub-pixel PX4 along the second direction Y, and a sum of length H22 of the sub-pixels PX5 and PX6 along the second direction Y are equal. Each of the lengths H12 and H21 of the sub-pixels PX2 and PX4 is approximately twice as great as the length of each of the sub-pixels PX1, PX3, PX5 and PX6 along the second direction Y.

FIG. 5 is an illustration showing a configuration example of pixel electrodes PE1 to PE6. In the example illustrated, the unit pixel UPX is composed to correspond to the fringe field switching (FFS) mode as the display mode.

The pixel electrodes PE1 to PE6 are opposed to a common electrode CE. The pixel electrodes PE1 to PE3 extend in a first extending direction D1 which intersects the second direction Y clockwise at an acute angle. The pixel electrodes PE4 to PE6 extend in a second extending direction D2 which intersects the second direction Y counterclockwise at an acute angle. More specifically, the pixel electrode PE1 includes strip electrodes PA1 and a slit SL1 which extend along the first extending direction D1. The pixel electrodes PE2 and PE3 are formed similarly to the pixel electrode PE1. The pixel electrode PE4 includes strip electrodes PA2 and a slit SL2 which extend along the second extending direction D2. The pixel electrodes PE5 and PE6 are formed similarly to the pixel electrode PE4. The shape of the pixel electrodes PE1 to PE6 is not limited to the example illustrated, but may be the other shape such as a shape of a comb electrode.

Figure 6:
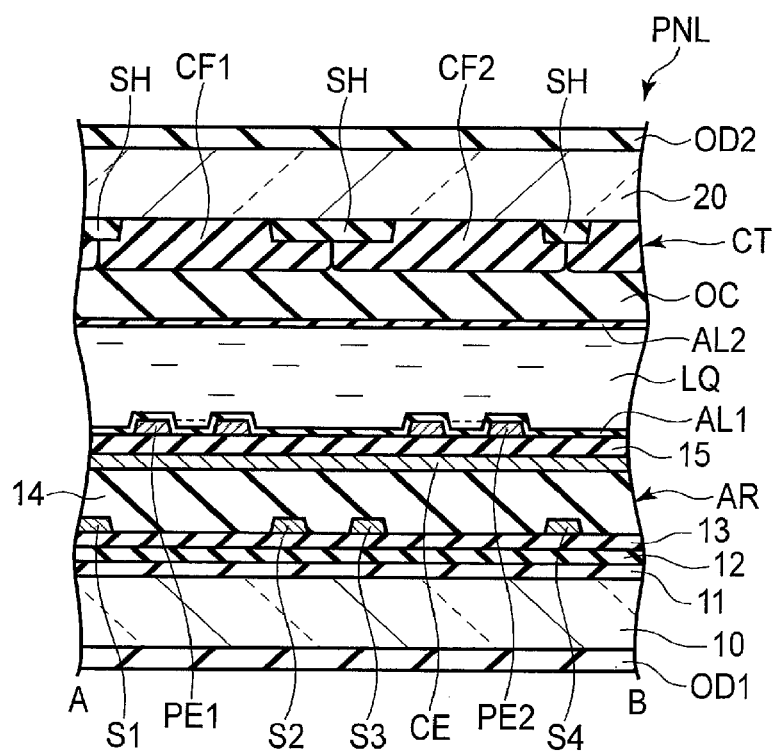
FIG. 6 is a schematic cross-sectional view showing the display panel PNL seen along line A-B of FIG. 5.

FIG. 6 is a schematic cross-sectional view showing the display panel PNL seen along line A-B of FIG. 5.

The array substrate AR is formed of an insulating substrate 10 having a light transmitting property such as a glass substrate or a resin substrate. The array substrate AR includes the source lines S1 to S4, the common electrode CE, the pixel electrodes PE1 and PE2, insulating films 11 to 15, an alignment film AL1 and the like, on a side of the insulating substrate 10 which is opposed to the counter-substrate CT. The array substrate AR also includes a gate line, a switching element, and the like though not shown. The switching element has, for example, a top-gate structure and comprises a semiconductor layer disposed between the insulating films 11 and 12. The gate line is disposed between the insulating films 12 and 13. The source lines S1 to S4 are disposed between the insulating films 13 and 14. The common electrode CE is disposed between the insulating films 14 and 15. The pixel electrodes PE1 and PE2 are disposed between the insulating film 15 and the alignment film AL1. The common electrode CE and the pixel electrodes PE1 and PE2 are formed of, for example, a transparent, electrically conductive material such as indium zinc oxide (IZO) or indium tin oxide (ITO).

The counter-substrate CT is formed by using an insulating substrate 20 having a light transmitting property such as a glass substrate or a resin substrate. The counter-substrate CT includes a light shielding layer SH, the color filters CF1 and CF2, an overcoat layer OC, an alignment film AL2, and the like, on the side of the insulating substrate 10 which is opposed to the array substrate AR. The light-shielding layer SH is formed at a position opposed to the source lines S1 to S4. The light-shielding layer SH is also formed at a position opposed to the gate line and the switching element, though not shown. The color filter CF1 is opposed to the pixel electrode PE1. The color filter CF2 is opposed to the pixel electrode PE2. The color filters CF3 and CF4 (not shown) are opposed to the pixel electrodes PE3 and PE4, respectively. The light-shielding layer SH is overlaid on ends of each of the color filters CF1 and CF2. The overcoat layer OC covers the color filters CF1 and CF2. The overcoat layer OC is formed of a transparent resin material. The alignment film AL2 is formed on a side of the overcoat layer OC which is opposed to the array substrate AR. The alignment films AL1 and AL2 are formed of a material having a horizontal alignment property. In the example illustrated, the color filters are formed in the counter-substrate CT, but may be formed in the array substrate AR.

As shown in the figure, both the pixel electrodes PE and the common electrode CE are disposed on the array substrate AR, in the display panel PNL of the display mode utilizing the lateral electric field. The display panel PNL may be configured to correspond to a display mode using the longitudinal electric field or the oblique electric field and, in this display mode, the pixel electrodes PE are disposed on the array substrate AR while the common electrode CE is disposed on the counter-electrode CT.

In the present embodiment, the unit pixel UPX is composed of the sub-pixels of two columns arranged in the first direction X, and the width of each sub-pixel in the first direction X can be increased, for example, can be approximately one and half times as great as that in a unit pixel of a configuration in which the red sub-pixel, the green sub-pixel and the blue sub-pixel are arranged in the first direction X. In other words, according to the present embodiment, a sub-pixel having a comparatively great width can be obtained and the lowering of the aperture ratio can be suppressed, in the display device having high resolution of 400 ppi or higher or 600 ppi level.

In contrast, a problem mentioned below arises in a unit pixel in which the green sub-pixels PX1 and PX5 and the red sub-pixels PX3 and PX6 are located in the same column and the blue sub-pixel PX2 and the white sub-pixel PX4 are located in the same column. In other words, each of the area of the green sub-pixels PX1 and PX5, the area of the red sub-pixels PX3 and PX6, and the area of the blue sub-pixel PX2 is set to optimize the color chromaticity when the white color is exhibited in the unit pixel. In addition, the area of the white sub-pixel PX4 is set to optimize, for example, luminance, transmittance, and the like in the unit pixel. The area of each of the sub-pixels PX1 to PX6 is mainly adjusted according to the width along the first direction X. If the sub-pixels PX2 and PX4 are located in the same column, it is difficult to set the widths of the respective sub-pixels PX2 and PX4 at different values in order to attain, for example, different objects such as optimization of the color chromaticity and optimization of the luminance. In addition, when the white color chromaticity or the like is optimized, in the unit pixel, the width of the blue sub-pixel is often small as compared with the width of each of the green and red sub-pixels. In this case, the line length for electric connection between the pixel electrodes and the switching elements is increased and the aperture ratio is lowered, in the blue sub-pixel.

According to the present embodiment, since the blue sub-pixel PX2 and the white sub-pixel PX4 are located in different columns, in the unit pixel UPX, the widths of the respective sub-pixels PX2 and PX4 along the first direction X can be adjusted independently of each other. In other words, the width of the sub-pixel PX2 can be set in accordance with the area of the sub-pixel PX2 required to optimize, for example, the white color chromaticity of the unit pixel UPX. The width of the sub-pixel PX4 can be set in accordance with the area of the sub-pixel PX4 required to optimize, for example, the luminance and the like of the unit pixel UPX.

In addition, since the width of the sub-pixel PX4 can be set together with the widths of the sub-pixels PX1 and PX3 and since the width of the sub-pixel PX2 can be set together with the widths of the sub-pixels PX5 and PX6, the width cannot be extremely small at any of the sub-pixels PX1 to PX6. In other words, a sufficient width can be secured at any of the sub-pixels PX1 to PX6, and the lowering the aperture ratio caused by the increase in line length in the sub-pixel of a specific color can be suppressed.

Since each of the sub-pixels PX1 to PX6 has a comparatively great width along the first direction X, color mixing between the sub-pixels of different colors adjacent in the first direction X can be suppressed. The color mixing is caused by allowing the light incident on the display panel PNL from a direction inclined to a normal line of a main surface of the display panel PNL to pass through the color filters which do not match each other. For example, if a red color alone is displayed on the unit pixel, the only light passing through the red color filter disposed in the red sub-pixel should contribute to the display but, the red color and the blue color are visually recognized as mixed colors in a case where the light passing through the blue color filter arranged in the blue sub-pixel adjacent to the red sub-pixel in the first direction X also contributes to the display. The mismatch light passing through the color filters of the adjacent sub-pixels and causing the color mixing is thus generated on a boundary between adjacent sub-pixels. If the size of the sub-pixel is large or the width of the sub-pixel in the first direction X is great, the rate of the mismatch light contributing to the display becomes extremely small since most of the light passes through the color filter of the color which should be inherently displayed and contributes to the display. Thus, if the sub-pixel has a comparatively great width along the first direction X, the color mixing can hardly be recognized visually and the deterioration in display quality can be suppressed.

In the unit pixel UPX of the present embodiment, the width W1 of the sub-pixels PX1, PX3 and PX4, and the width W2 of the sub-pixels PX2, PX5 and PX6 are set to be greater than one third of the sum WP of the widths W1 and W2 and smaller than two thirds of the sum WP, since each of the widths is desirably greater than the width of each sub-pixel in the unit pixel of the configuration in which the red sub-pixels, the green sub-pixels, and the blue sub-pixel are arranged in the first direction X.

Next, another configuration example of the present embodiment will be explained.

Figure 7:
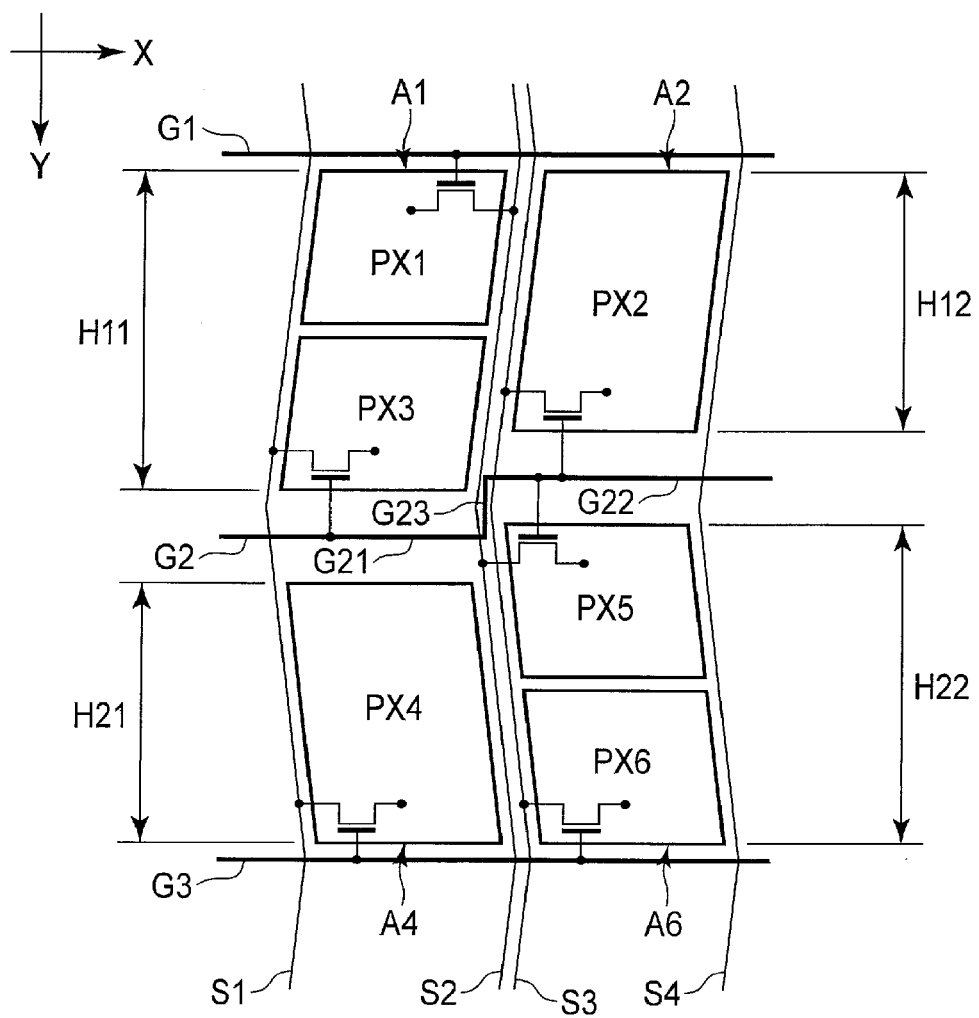
FIG. 7 is an illustration showing another configuration example of the unit pixel UPX.

FIG. 7 is an illustration showing another configuration example of the unit pixel UPX. The configuration example shown in the figure is different from the configuration example shown in FIG. 4 with respect to features that the sum H11 of lengths of the sub-pixels PX1 and PX3 along the second direction Y is greater than the length H12 of the sub-pixel PX2 along the second direction Y and that the sum H22 of lengths of the sub-pixels PX5 and PX6 along the second direction Y is greater than the length H21 of the sub-pixel PX4 along the second direction Y.

In the example illustrated, each of the gate lines G1 and G3 extends linearly along the first direction X, and the gate line G2 is bent. More specifically, the gate line G2 includes segments G21 and G22 extending linearly along the first direction X, and a segment G23 extending in the second direction Y. The segment G21 is located between the sub-pixels PX3 and PX4 and closer to the gate line G3 than to the gate line G1. The segment G22 is located between the sub-pixels PX2 and PX5 and closer to the gate line G1 than to the gate line G3. In other words, the segments G21 and G22 are disposed at positions displaced in the second direction Y. The segment G23 is connected to the segments G21 and G22 at positions which intersect the source lines S2 and S3.

End portions A1 and A2 on sides of the respective sub-pixels PX1 and PX2 which are close to the gate line G1 are arranged along in the first direction X. End portions A4 and A6 on sides of the respective sub-pixels PX4 and PX6 which are close to the gate line G3 are arranged along in the first direction X.

In this configuration example, too, the same advantages as those explained above can be obtained. Furthermore, in the unit pixel UPX, the area of the sub-pixel of each color can be adjusted in accordance with not only the width along the first direction X, but also the length along the second direction Y. The degree of freedom to adjust the area of each sub-pixel can be increased to obtain the desired color chromaticity and transmittance.

Figure 8:
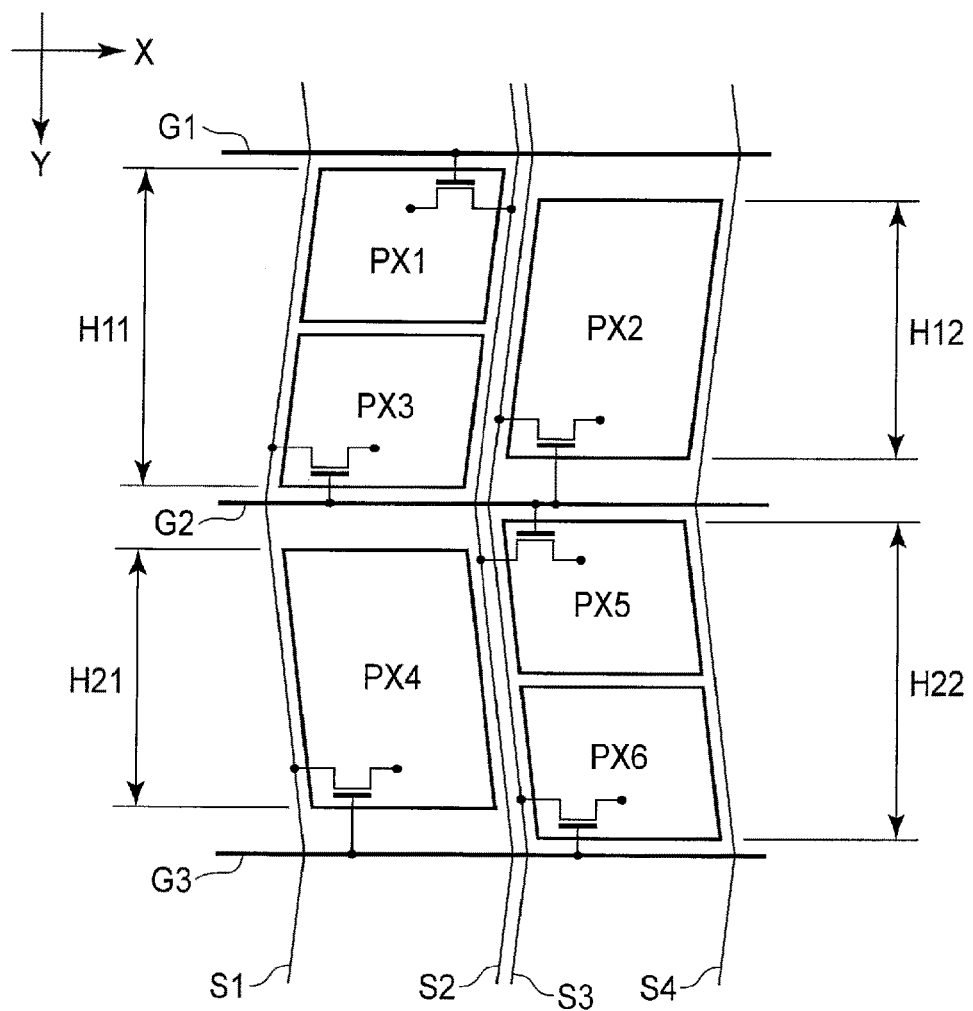
FIG. 8 is an illustration showing yet another configuration example of the unit pixel UPX.

FIG. 8 is an illustration showing yet another configuration example of the unit pixel UPX. The configuration example shown in the figure is different from the configuration example shown in FIG. 7 with respect to features that the each of the gate lines G1 to G3 extends linearly along the first direction X, that the sub-pixel PX2 is located at a substantially middle point between the gate lines G1 and G2, and that the sub-pixel PX4 is located at a substantially middle point between the gate lines G2 and G3. The configuration example is the same as the configuration example shown in FIG. 7 with respect to features that the sum H11 is greater than the length H12 and that the sum H22 is greater than the length H21.

In this configuration example, too, the same advantages as those of the configuration example shown in FIG. 7 can be obtained. Furthermore, since each of the gate lines is formed linearly, the line resistance of the gate lines can be made to be equal.

Figure 9:
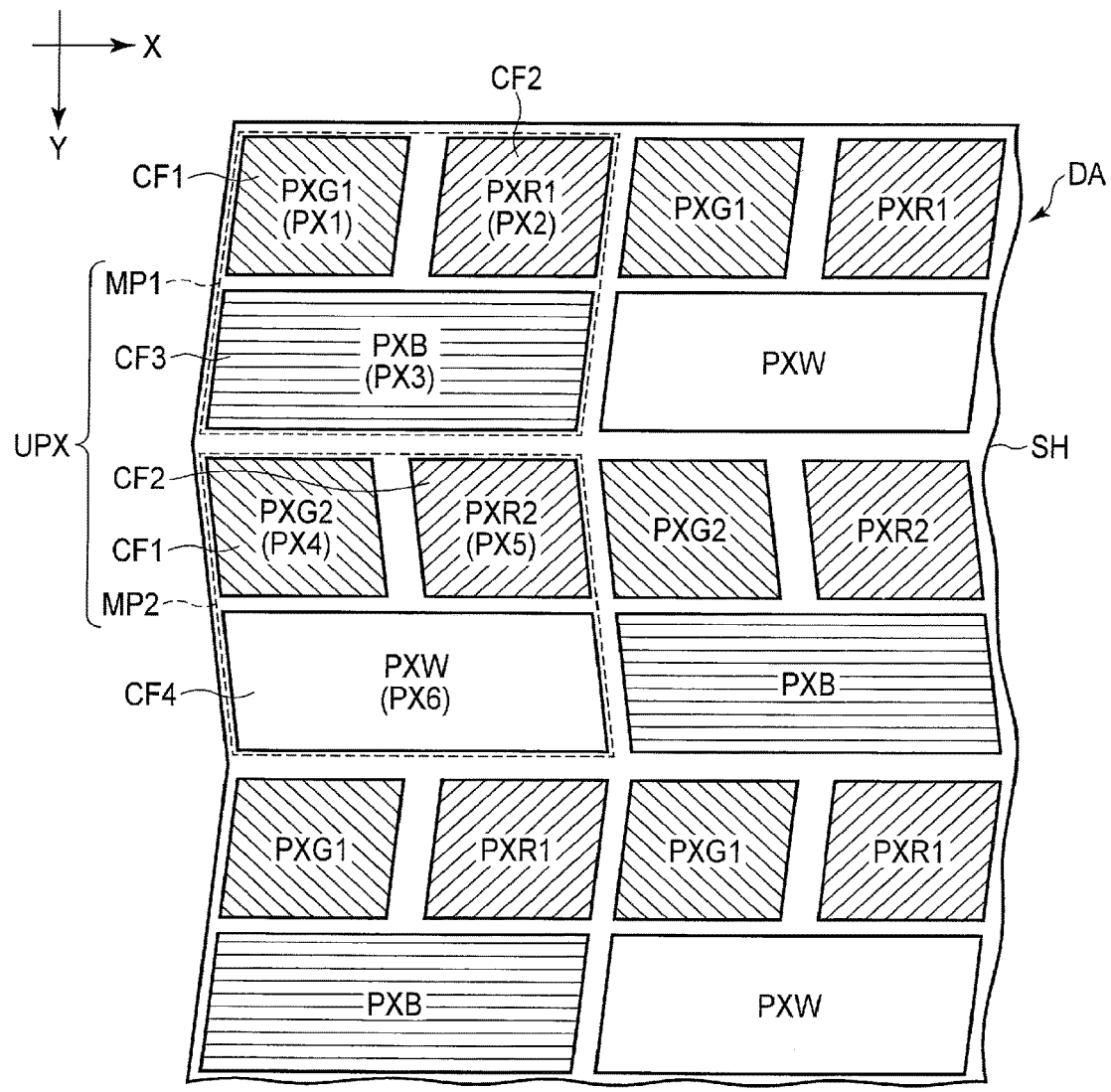
FIG. 9 is an illustration showing another example of the pixel array in the display area DA.

FIG. 9 is an illustration showing another example of the pixel array in the display area DA. The illustrated example of the pixel array is different from the example shown in FIG. 3 with respect to the array of the sub-pixels constituting the main pixels MP1 and MP2.

The sub-pixels PX1 and PX2 are arranged in the first direction X, in the main pixel MP1. The sub-pixel PX3 is arranged in the second direction Y of the sub-pixels PX1 and PX2. The sub-pixels PX4 and PX5 are arranged in the first direction X, in the main pixel MP2. The sub-pixel PX6 is arranged in the second direction Y of the sub-pixels PX4 and PX5. The main pixels MP1 and MP2 are arranged in the second direction Y. In the example illustrated, the sub-pixel PX3 is arranged in the second direction Y of the sub-pixels PX4 and PX5.

The sub-pixel PX1 is a pixel exhibiting the first color and includes the color filter CF1 of the first color. The sub-pixel PX2 is a pixel exhibiting the second color different from the first color and includes the color filter CF2 of the second color. The sub-pixel PX3 is a pixel exhibiting the third color different from the first and second colors and includes the color filter CF3 of the third color. The sub-pixel PX4 is a pixel exhibiting either of the first color and the second color. The sub-pixel PX5 is a pixel exhibiting the other of the first color and the second color. The sub-pixel PX6 is a pixel exhibiting the fourth color different from the first to third colors and includes the color filter CF4 of the fourth color. In the example illustrated, the sub-pixel PX4 is a pixel exhibiting the first color and includes the color filter CF1. The sub-pixel PX5 is a pixel exhibiting the second color and includes the color filter CF2. The sub-pixel PX4 may be configured to exhibit the same color as the sub-pixel PX2, and the sub-pixel PX5 may be configured to exhibit the same color as the pixel PX1. The sub-pixel PX6 may be configured to exhibit the same color as the sub-pixel PX3. For example, the first color is green, the second color is red, the third color is blue, and the fourth color is white or substantially transparent.

In the unit pixel UPX, the sub-pixels PX1, PX2, PX4 and PX5 have a substantially equal first area, and the sub-pixels PX3 and PX6 have a second area larger than the first area. In the example illustrated, the sub-pixels PX3 and PX6 are laterally elongated to extend in the first direction X. For example, the second area is approximately twice as large as the first area. The sub-pixel PX3 may have an area different from the area of the sub-pixel PX6.

The light-shielding layer SH is disposed to section the sub-pixels, and extend between the sub-pixels adjacent to each other in the first direction X and the second direction Y.

FIG. 10 is an illustration showing a configuration example of a unit pixel UPX shown in FIG. 9.

The source lines S1 to S4 are arranged in the first direction X. The gate lines G1 to G2 are arranged in the second direction Y. The gate line G1 is located between the sub-pixels PX1 and PX2 and the sub-pixel PX3. The gate line G2 is located between the sub-pixels PX4 and PX5 and the sub-pixel PX6. The sub-pixels PX3 to PX5 are disposed between the gate lines G1 and G2 adjacent in the second direction Y. In other words, no gate lines are disposed between the sub-pixel PX3 and the sub-pixels PX4 and PX5. The source lines S2 and S3 are located between the sub-pixels PX1 and PX2 and between the sub-pixels PX4 and PX5, and cross the sub-pixels PX3 and PX6.

The sub-pixel PX1 includes the switching element SW1 electrically connected with the gate line G1 and the source line S1, and the pixel electrode PE1 electrically connected with the switching element SW1. The sub-pixel PX2 includes the switching element SW2 electrically connected with the gate line G1 and the source line S3, and the pixel electrode PE2 electrically connected with the switching element SW2. The sub-pixel PX3 includes the switching element SW3 electrically connected with the gate line G1 and the source line S2, and the pixel electrode PE3 electrically connected with the switching element SW3. The sub-pixel PX4 includes the switching element SW4 electrically connected with the gate line G2 and the source line S1, and the pixel electrode PE4 electrically connected with the switching element SW4. The sub-pixel PX5 includes the switching element SW5 electrically connected with the gate line G2 and the source line S3, and the pixel electrode PE5 electrically connected with the switching element SW5. The sub-pixel PX6 includes the switching element SW6 electrically connected with the gate line G2 and the source line S3, and the pixel electrode PE6 electrically connected with the switching element SW6.

For example, the sum H11 of lengths of the sub-pixels PX1 and PX3 along the second direction Y, and the sum H21 of lengths of the sub-pixels PX4 and PX6 along the second direction Y are equal to each other but may be different from each other. In the example illustrated, the lengths of the sub-pixels PX1 to PX6 along the second direction Y are equal but are not limited to this example. The widths of the sub-pixels PX1, PX2, PX4 and PX5 along the first direction X are equal to each other, and the widths of the sub-pixels PX3 and PX6 along the first direction X are equal to each other. In the example illustrated, the width of the sub-pixel PX3 or the like is approximately twice as great as the sub-pixel PX1 or the like but is not limited to this example.

In this configuration example, too, the same advantages as those explained above can be obtained. In addition, the number of gate lines required for the unit pixel UPX can be reduced. For this reason, a selection period for selecting each gate line can be secured to be longer in a frame period, and shortage of write of an image signal to each pixel can also be suppressed in a high-resolution display device.

Figure 11:
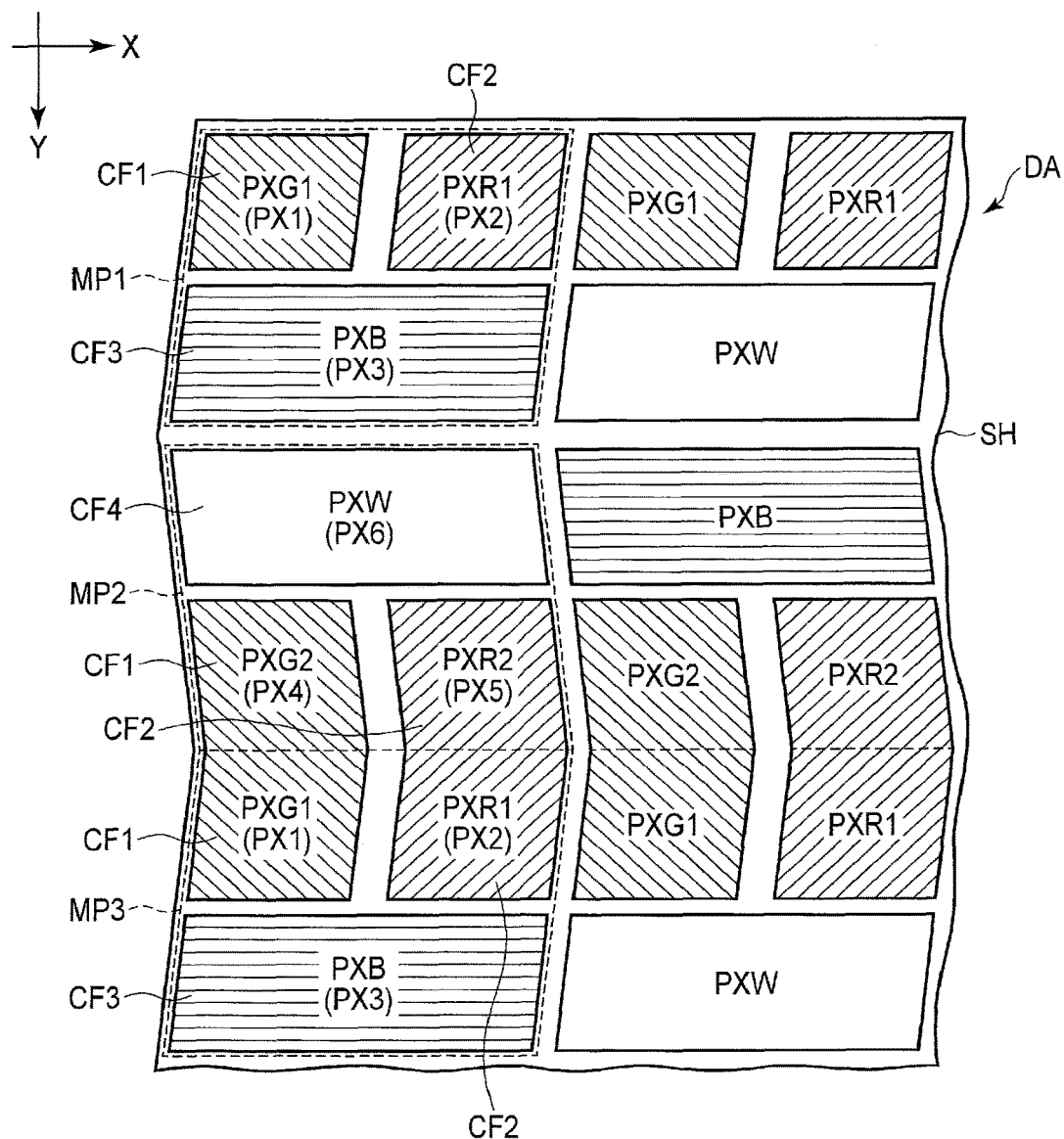
FIG. 11 is an illustration showing another example of the pixel array in the display area DA.

FIG. 11 is an illustration showing another example of the pixel array in the display area DA.

The display area DA includes the main pixels MP1 to MP3 arranged in the second direction Y. The main pixel MP1 has the same configuration as that shown in FIG. 9. In the main pixel MP2, the sub-pixels PX4 and PX5 are replaced with the sub-pixel PX6, in comparison with the example shown in FIG. 9. The main pixel MP3 has the same configuration as the main pixel MP1. The display colors of the sub-pixels, and the connection between the gate lines and the source lines in the sub-pixels have been explained above. If the main pixels MP1 and MP2 are noticed, the laterally elongated sub-pixels PX3 and PX6 are arranged in the second direction Y. If the main pixels MP2 and MP3 are noticed, the sub-pixels PX1 and PX4, and the sub-pixels PX2 and PX5 are arranged in the second direction Y. The sub-pixel PX4 includes the color filter CF1 and exhibits the first color which is the same as the color of the sub-pixel PX1. The sub-pixel PX5 includes the color filter CF2 and exhibits the second color which is the same as the color of the sub-pixel PX2. In other words, the color filter CF1 is formed to extend across the sub-pixels PX1 and PX4 and the color filter CF2 is formed to extend across the sub-pixels PX2 and PX5.

The light-shielding layer SH is disposed to section the sub-pixels, and extend between the sub-pixels adjacent to each other in the first direction X and the second direction Y. On the boundary between the main pixels MP2 and MP3, however, the light-shielding layer SH extending in the first direction X is not disposed.

In this configuration example, too, the same advantages as those explained above can be obtained. In addition, the number of gate lines can be reduced, similarly to the configuration example shown in FIG. 9 or the like. Furthermore, since the sub-pixels exhibiting the same colors are arranged in the second direction Y, on the boundary between the main pixels MP2 and MP3, the light-shielding layer SH does not need to be disposed. Thus, the length of each sub-pixel along the second direction Y can be increased and the aperture ratio of each sub-pixel can also be increased.

FIG. 12 is an illustration showing yet another example of the pixel array in the display area DA. The illustrated example of the pixel array is different from the example shown in FIG. 11 with respect to a feature that the sub-pixels PX3 and PX6 arranged in the second direction Y are the pixels exhibiting the same color. In other words, each of the sub-pixels PX1 and PX4 includes the color filter CF1, and exhibits the first color. Each of the sub-pixels PX2 and PX5 includes the color filter CF2 and exhibits the second color. Each of the sub-pixels PX3 and PX6 includes the color filter CF3 and exhibits the third color. In the example illustrated, the first color is green, the second color is red, and the third color is blue. In other words, the color filter CF1 is formed to extend across the sub-pixels PX1 and PX4, the color filter CF2 is formed to extend across the sub-pixels PX2 and PX5, and the color filter CF3 is formed to extend across the sub-pixels PX3 and PX6.

Combination of the first to third colors is not limited to the example illustrated, but the third color may be red or green. Each of the first and second colors is blue or green if the third color is red, and each of the first and second colors is blue or red if the third color is green.

The light-shielding layer SH is disposed to section the sub-pixels, and extend between the sub-pixels adjacent to each other in the first direction X and the second direction Y. On the boundary between the main pixels MP1 and MP2 and the boundary between the main pixels MP2 and MP3, however, the light-shielding layer SH extending in the first direction X is not disposed.

In this configuration example, too, the same advantages as those explained above can be obtained. In addition, the number of gate lines can be reduced, similarly to the configuration example shown in FIG. 9 or the like. Furthermore, since the sub-pixels exhibiting the same colors are arranged in the second direction Y, on the boundary between the main pixels MP1 and MP2 and the boundary between the main pixels MP2 and MP3, the light-shielding layer SH does not need to be disposed. The aperture ratio of each sub-pixel can be thereby increased.

As explained above, a display device capable of suppressing the deterioration in display quality can be provided by the present embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device, comprising:
a first main pixel including a first sub-pixel which exhibits a first color, a second sub-pixel which exhibits a second color different from the first color and is arranged in a first direction with respect to the first sub-pixel, and a third sub-pixel which exhibits a third color different from the first and second colors and is arranged in a second direction with respect to the first and second sub-pixels;

a second main pixel arranged in the second direction with respect to the first main sub-pixel, including a fourth sub-pixel which exhibits one of the first and second colors, a fifth sub-pixel which exhibits the other of the first and second colors and is arranged in the first direction with respect to the fourth sub-pixel, and a sixth sub-pixel which is arranged in the second direction with respect to the fourth and fifth sub-pixels;

first to fourth source lines arranged in the first direction; and first to second gate lines arranged in the second direction, wherein the first gate line is located between the first and second sub-pixels and the third sub-pixel, the second gate line is located between the fourth and fifth sub-pixels and the sixth sub-pixel, and the second and third source lines are located between the first and second sub-pixels and between the fourth and fifth sub-pixels, and intersect the third and sixth sub-pixels.

2. The display device of claim 1, wherein the sixth sub-pixel exhibits a fourth color different from the first to third colors, and one of the first and second colors is green, the other of the first and second colors is red, the third color is blue, and the fourth color is white.

3. The display device of claim 1, wherein the sixth sub-pixel exhibits the third color, and the third color is any one of red, green and blue.

4. The display device of claim 1, wherein the third sub-pixel is arranged in the second direction with respect to the fourth and fifth sub-pixels.

5. The display device of claim 1, wherein the third sub-pixel is arranged in the second direction with respect to the sixth sub-pixel.

6. The display device of claim 1, wherein the fourth sub-pixel exhibits the first color and is arranged in the second direction with respect to the first sub-pixel, and the fifth sub-pixel exhibits the second color and is arranged in the second direction with respect to the second sub-pixel.

* * * * *